United States Patent
Lai et al.

(10) Patent No.: US 12,525,556 B2
(45) Date of Patent: Jan. 13, 2026

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Yen-Kun Lai, New Taipei (TW); Yi-Wen Wu, Xizhi (TW); Kuo-Chin Chang, Chiayi (TW); Po-Hao Tsai, Zhongli (TW); Mirng-Ji Lii, Sinpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 652 days.

(21) Appl. No.: 17/707,481

(22) Filed: Mar. 29, 2022

(65) Prior Publication Data

US 2023/0061716 A1     Mar. 2, 2023

Related U.S. Application Data

(60) Provisional application No. 63/237,681, filed on Aug. 27, 2021.

(51) Int. Cl.
*H01L 23/00*     (2006.01)

(52) U.S. Cl.
CPC .............. *H01L 24/05* (2013.01); *H01L 24/03* (2013.01); *H01L 24/13* (2013.01);
(Continued)

(58) Field of Classification Search
CPC ......... H01L 24/05; H01L 24/03; H01L 24/13; H01L 2224/0311; H01L 2224/0401; H01L 2224/05018; H01L 2224/05024; H01L 2224/13026; H01L 24/02; H01L 24/11; H01L 2224/02321; H01L 2224/02331; H01L 2224/03831; H01L 23/3192; H01L 2224/0236; H01L 2224/03912; H01L 2224/05558; H01L 2224/13082; H01L 21/76802; H01L 21/76816; H01L 21/76877; H01L 23/485; H01L 21/56;
(Continued)

(56) References Cited

U.S. PATENT DOCUMENTS

| 11,705,418 B2 | 7/2023 | Chung et al. |
| 2012/0049343 A1 | 3/2012 | Schulze et al. |

(Continued)

FOREIGN PATENT DOCUMENTS

| KR | 20010038370 A | 5/2001 |
| KR | 20210084736 A | 7/2021 |
| TW | 201205750 A | 2/2012 |

*Primary Examiner* — Fernando L Toledo
*Assistant Examiner* — Shawn Shaw Muslim
(74) *Attorney, Agent, or Firm* — Slater Matsil, LLP (57) ABSTRACT

Semiconductor devices and methods of manufacturing are provided, wherein a first passivation layer is deposited over a top redistribution structure; a second passivation layer is deposited over the first passivation layer; and a first opening is formed through the second passivation layer. After the forming the first opening, the first opening is reshaped into a second opening; a third opening is formed through the first passivation layer; and filling the second opening and the third opening with a conductive material.

20 Claims, 11 Drawing Sheets

(52) U.S. Cl.
CPC ............ *H01L 2224/0311* (2013.01); *H01L 2224/0401* (2013.01); *H01L 2224/05018* (2013.01); *H01L 2224/05024* (2013.01); *H01L 2224/13026* (2013.01)

(58) Field of Classification Search
CPC ............ H01L 24/07; H01L 2224/0231; H01L 2224/02333; H01L 2224/0235; H01L 2224/02371; H01L 2224/02381
See application file for complete search history.

(56) References Cited

U.S. PATENT DOCUMENTS

| | | | |
|---|---|---|---|
| 2015/0243531 A1* | 8/2015 | Ho | H01L 24/97 438/126 |
| 2016/0197029 A1* | 7/2016 | Tsai | H01L 25/0657 257/774 |

\* cited by examiner

SEMICONDUCTOR DEVICES AND METHODS OF MANUFACTURE

PRIORITY CLAIM AND CROSS-REFERENCE

This application claims the benefit of U.S. Provisional Application No. 63/237,681, filed on Aug. 27, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. They are then connected to other devices using, e.g., external connectors.

The semiconductor industry continues to improve the integration density of various electronic components (e.g., transistors, diodes, resistors, capacitors, etc.) by continual reductions in minimum feature size, which allow more components to be integrated into a given area, and more connections to other devices to be made. However, as the minimum features sizes are reduced for each component, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular structures which utilize connective structures that enhance overall package reliability. In the embodiments specifically described, passivation layers are reshaped in order to obtain more advantageous angles which help to alleviate stresses during testing and operation. However, the embodiments described herein are intended to be illustrative and are not intended to be limiting to the ideas.

Figure 1:
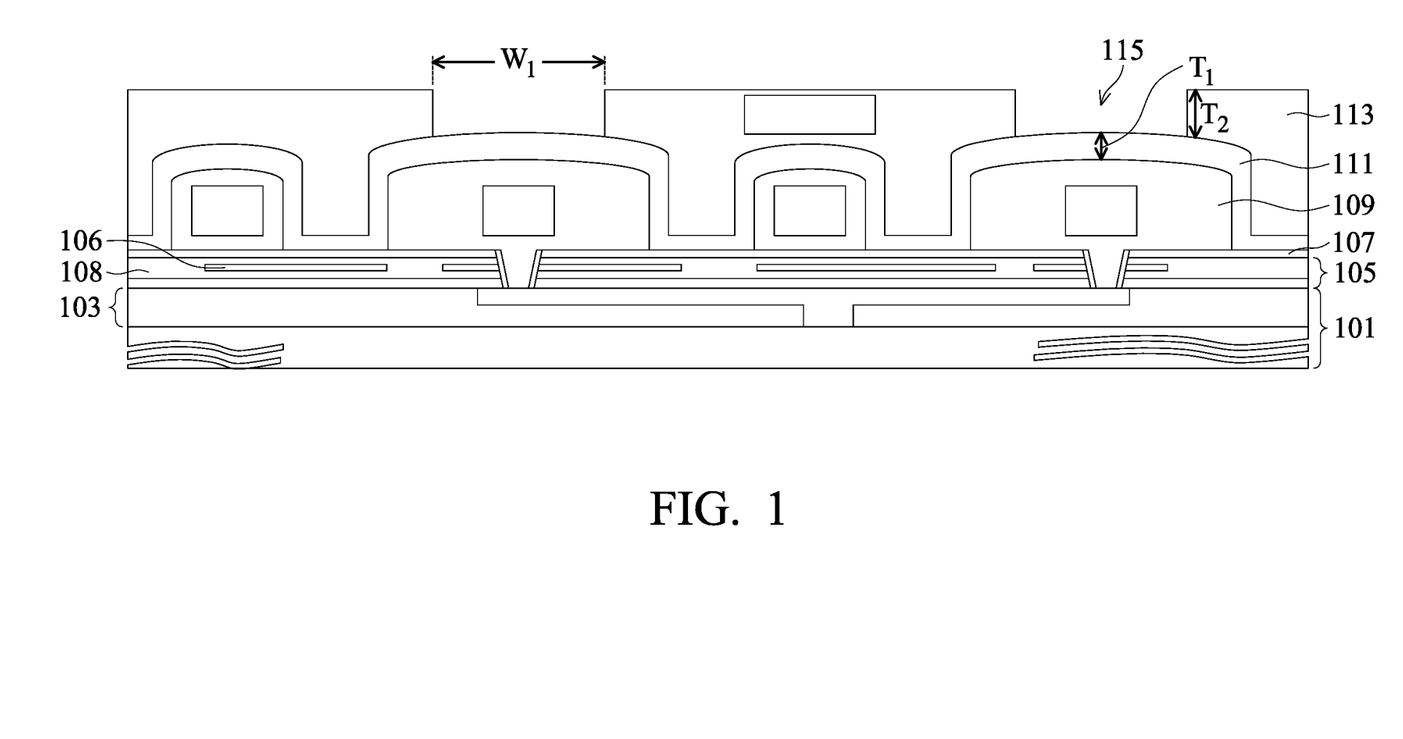
FIG. 1 illustrates deposition of passivation layers over a redistribution structure, in accordance with some embodiments.

Turning now to FIG. 1, FIG. 1 illustrates a first semiconductor device 101 with an overlying first redistribution structure 105, a first passivation layer 107, a top redistribution layer 109, and a second passivation layer 111. In an embodiment the first semiconductor device 101 may be a semiconductor die and comprise a semiconductor substrate that is part of a semiconductor wafer (not fully shown as a remainder of the semiconductor wafer extends away from the structure illustrated in FIG. 1). In other embodiments the first semiconductor device 101 may be separated from a semiconductor wafer, such as already being formed and singulated. Any suitable embodiment may be utilized.

The semiconductor substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, the semiconductor substrate at this point in the process may be part of a semiconductor wafer (the full wafer of which is not illustrated in FIG. 1) that will be singulated in a later step.

The first semiconductor device 101 additionally comprises active devices (not separately illustrated) and passive devices in order to provide a desired functionality to the first semiconductor device 101. However, as one of skill in the art will recognize, a wide variety of active devices such as capacitors, resistors, inductors and the like may be used to generate the desired structural and functional requirements of the design for the first semiconductor device 101. The active devices may be formed using any suitable methods either within or else on the surface of the semiconductor substrate.

Metallization layers are formed over the semiconductor substrate and the active devices and are designed to connect the various active devices to form functional circuitry. The metallization layers are formed of alternating layers of dielectric and conductive material and may be formed through any suitable process (such as deposition, damascene, dual damascene, etc.). In an embodiment there may be thirteen layers of metallization separated from the semiconductor substrate, but the precise number of metallization layers is dependent upon the design of the first semiconductor device 101.

As part of the metallization layers, a top metal layer 103 is formed as a top most layer within the metallization layers. In an embodiment the top metal layer 103 is the thirteenth metallization layer and includes a dielectric layer and conductive features formed within the dielectric layer. The top metal layer 103 may be formed by initially depositing the dielectric layer over a top surface of underlying layers of the metallization layers (e.g., over the twelfth metallization layer of the metallization layers). The dielectric layer may be deposited by chemical vapor deposition (CVD), physical vapor deposition (PVD), or the like. The dielectric layer may comprise a dielectric material such as silicon oxide, SiCOH, combinations of these, or the like. However, any suitable material may be utilized.

Once the dielectric layer has been formed, the dielectric layer may then be etched to form openings exposing a top surface of the underlying layers of the metallization layers. In an embodiment the dielectric layer may be etched using, e.g., a via first dual damascene process, whereby a first masking and etching process is utilized to pattern and etch a via pattern at least partially into the dielectric layer. Once the via pattern is etched, a second masking and etching process is utilized to pattern and etch a trench pattern into the dielectric layer, wherein the etching of the trench pattern further extends the via pattern through the dielectric layer to expose the underlying layer (e.g., the twelfth metallization layer of the metallization layers).

However, while a via first dual damascene structure is described, this is intended to merely be illustrative and is not intended to be limiting upon the embodiments. Rather, any suitable process or processes may be utilized to form the via openings and trench openings of the top metal layer 103. For example, a trench first dual damascene process, or even multiple single damascene processes, may be utilized. All such processes are fully intended to be included within the scope of the embodiments.

Once the via openings and trench openings have been formed, the conductive features may be formed by depositing conductive material in the via openings and the trench openings using, for example, a plating process. In an embodiment the conductive features may include conductive trenches and conductive vias connecting the conductive trenches to underlying structures (e.g., the twelfth metallization layer of the metallization layers). In an embodiment the conductive material may be copper, a copper alloy, aluminum, an aluminum alloy, combinations of these, or the like. However, any suitable material and any suitable process of formation may be utilized.

Once the via openings and trench openings have been filled and/or overfilled by the conductive material, the conductive features may be formed by removing excess material from outside of the via openings and the trench openings. In an embodiment the removal may be performed using a planarization process such as a chemical mechanical polishing (CMP) process. However, any suitable removal process may be utilized.

Optionally, at this point, a singulation process may be performed to separate out the first semiconductor device 101 from a remainder of the wafer, and an encapsulation process may be performed in order to help package the first semiconductor device 101. In an embodiment the singulation may be performed by using a saw blade (not separately illustrated) to slice through the semiconductor substrate. However, as one of ordinary skill in the art will recognize, utilizing a saw blade for the singulation is merely one illustrative embodiment and is not intended to be limiting. Any method for performing the singulation, such as utilizing one or more etches, may be utilized. These methods and any other suitable methods may be utilized to singulate the first semiconductor device 101.

Also optionally, if desired the first semiconductor device 101 can be encapsulated along with one or more additional semiconductor devices (e.g., multiple ones of the first semiconductor device 101—not separately illustrated in FIG. 1) with an encapsulant. In an embodiment the first semiconductor device 101 may be encapsulated with an encapsulant, which may be a molding compound resin such as polyimide, PPS, PEEK, PES, a heat resistant crystal resin, combinations of these, or the like. Once in place, the encapsulant may be planarized with, e.g., a planarization process such as a chemical mechanical polishing process, such that the encapsulant is planar with the first semiconductor device 101.

Once the semiconductor device 101 has been encapsulated, a first redistribution structure 105 may be formed to help interconnect the first semiconductor device 101 with other devices. In an embodiment the first redistribution structure 105 may be formed over the first semiconductor device 101. In an embodiment the first redistribution structure 105 comprises a series of conductive layers 106 (such as three conductive layers) embedded within a series of dielectric layers 108 (such as three dielectric layers). In an embodiment, a first one of the series of dielectric layers 108 is formed over the first redistribution structure 105, and the first one of the series of dielectric layers 108 may be a material such as polybenzoxazole (PBO), although any suitable material, such as polyimide or a polyimide derivative, may be utilized. The first one of the series of dielectric layers 108 may be placed using, e.g., a spin-coating process, although any suitable method may be used.

After the first one of the series of dielectric layers 108 has been formed, openings may be made through the first one of the series of dielectric layers 108 by removing portions of the first one of the series of dielectric layers 108. The openings may be formed using a suitable photolithographic mask and etching process, although any suitable process or processes may be used to pattern the first one of the series of dielectric layers 108.

Once the first one of the series of dielectric layers 108 has been formed and patterned, a first one of the series of conductive layers 106 is formed over the first one of the series of dielectric layers 108 and through the openings formed within the first one of the series of dielectric layers 108. In an embodiment the first one of the series of conductive layers 106 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first one of the series of conductive layers 106 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers 106. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers 106 has been formed, a second one of the series of dielectric layers 108 and a second one of the series of conductive layers 106 may be formed by repeating steps similar to the first one of the series of dielectric layers 108 and the first one of the series of conductive layers 106. These steps may be repeated as desired in order to electrically connect each of the series of conductive layers 106 to an underlying one of the series of conductive layers 106, and may be repeated as often as desired until an uppermost one of the series of conductive layers 106 and an uppermost one of the series of dielectric layers 108 has been formed. In an embodiment the deposition and patterning of the series of conductive layers 106 and the series of dielectric layers 108 may be continued until the first redistribution structure 105 has a desired number of layers, such as three layers, although any suitable number of individual layers may be utilized.

A first passivation layer 107 may be formed over the first redistribution structure 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 µm and about 5 µm, such as about 9.25 KÅ.

Once the first passivation layer 107 has been formed, a top redistribution layer 109 may be formed. In an embodiment the top redistribution layer 109 may be begun by initially forming openings through the first passivation layer 107 and the first redistribution structure 105 to expose desired portions of the conductive material of either the first redistribution structure 105 (not separately illustrated in FIG. 1) or to the conductive material of the top metal layer 103 (as illustrated in FIG. 1). In an embodiment the openings may be formed using a suitable photolithographic masking and etching process. However, any suitable methods may be utilized.

Once the openings have been formed, the top redistribution layer 109 may be formed through the openings to make physical and/or electrical contact to the top metal layer 103 (or the first redistribution structure 105). In an embodiment the top redistribution layer 109 may be formed in a similar manner and using similar materials and processes as the conductive portions of the first redistribution structure 105. For example, a seed layer may be deposited, a photoresist may be placed and patterned over the seed layer, the desired portions of the top redistribution layer 109 are plated into the patterned photoresist, the photoresist is removed, and exposed portions of the seed layer are etched. However, any suitable method or materials may be used.

Once the top redistribution layer 109 has been formed, a second passivation layer 111 is formed over the top redistribution layer 109. In an embodiment the second passivation layer 111 may be deposited in a conformal manner using similar materials and methods as the first passivation layer 107. For example, the second passivation layer 111 may be a material such as silicon nitride deposited using chemical vapor deposition. Additionally, the first passivation layer 107 may be formed to a first thickness $T_1$ that is greater than zero, such as between about 0.5 µm and about 2.5 µm. However, any suitable methods and materials may be utilized.

In order to help protect the top redistribution layer 109, a third passivation layer 113 may be placed and patterned. In an embodiment the third passivation layer 113 may be a polymer material such as polyimide, SiOx, SiN, combinations of these, or the like, deposited using a blanket deposition process such as passivation. In an embodiment, after deposition, the third passivation layer 113 may be planarized using, e.g., a chemical mechanical polishing process to a second thickness $T_2$ (over the top redistribution layer 109) of between about 1.5 µm and about 7.5 µm. However, any suitable material and method of deposition may be utilized.

Once the third passivation layer 113 has been deposited and planarized, the third passivation layer 113 may be patterned in order to form first openings 115 through the third passivation layer 113 to expose portions of the second passivation layer 111. In an embodiment in which the polymer material of the third passivation layer 113 is photosensitive, the first openings 115 may be formed using a suitable photolithographic exposure and development process. In other embodiments in which the polymer material of the third passivation layer 113 is not photosensitive, the first openings 115 may be formed using a suitable photolithographic masking and etching process. However, any suitable process may be utilized.

In an embodiment the first openings 115 may be formed to expose a portion of, but not all of, a top surface of the second passivation layer 111. As such, the first openings 115 may be formed to have sidewalls perpendicular to the second passivation layer 111 and have a constant first width $W_1$ of between about 12 µm and about 50 µm. However, any suitable dimensions may be utilized.

Figure 2:
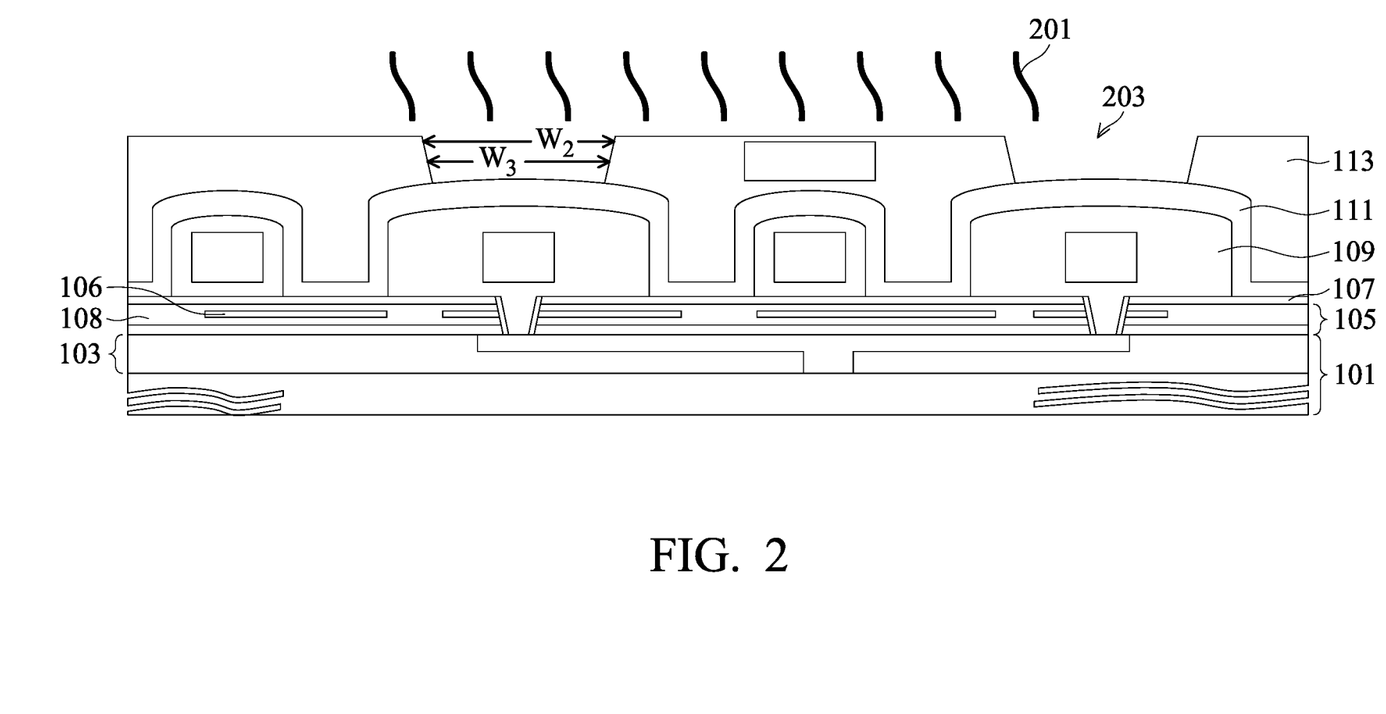
FIG. 2 illustrates an annealing process, in accordance with some embodiments.

FIG. 2 illustrates a curing process (represented in FIG. 2 by the wavy lines labeled 201) that is utilized to reshape the first openings 115 into second openings 203. In an embodiment the curing process 201 may be performed at a temperature of between about 230° C. and about 300° C. for a time of between about 2 hrs and about 5 hrs. However, any suitable time and temperature can be used to help reshape the first openings 115 into the second openings 203.

During the curing process 201, the material of the third passivation layer 113 will reshape to form the second openings 203. As such, the second openings 203 may now have a flared shape, wherein a portion of the second openings 203 adjacent to a top surface of the third passivation layer 113 has a second width $W_2$ of between about 14.2 µm and about 52.2 µm, while the second openings 203 adjacent to a bottom surface of the third passivation layer 113 has a third width $W_3$ of between about 13.2 µm and about 51.2 µm. However, any suitable widths may be utilized.

Additionally, while a curing process is described above as one method which may be used to achieve the flared shape of the second openings 203, the description of this method is intended as merely being descriptive, and is not intended to limit the embodiments to the curing process described. Rather, any suitable method may be used to deposit and reshape, or else deposit with the shape described. All such methods are fully intended to be included within the scope of the embodiment.

Figure 3A:
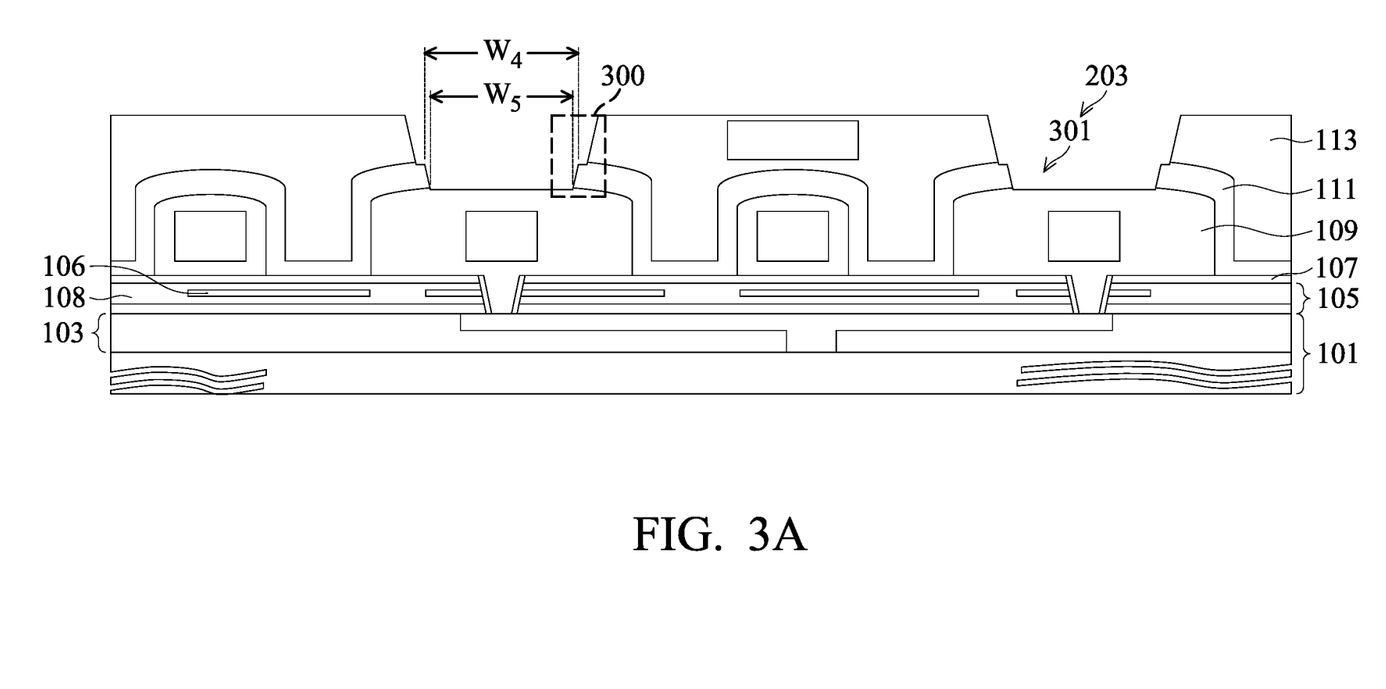
FIG. 3A-3B illustrate formation of an opening through a passivation layer, in accordance with some embodiments.

FIG. 3A illustrates that, once the curing process 201 has been performed and the material of the third passivation layer 113 has been reshaped into the second openings 203, the second passivation layer 111 may be patterned through the second openings 203 to form third openings 301 through the second passivation layer 111 to expose the top redistribution layer 109. In an embodiment the second passivation layer 111 may be patterned using a suitable photolithographic masking and dry etching process. However, any suitable other methods, such as a dry etching process without the use of a photoresist, may also be utilized.

The third openings 301 through the second passivation layer 111 may have a flared shape, wherein sidewalls of the third openings 301 have a different slope than the sidewalls of the second openings 203. For example, the third openings 301 adjacent to a top surface of the second passivation layer 111 may have a fourth width W4 of between about 12 µm and about 50 µm, while the third openings 301 adjacent to a bottom surface of the second passivation layer 111 have a fifth width $W_5$ of between about 10.2 µm and about 48.2 µm. As such, the third openings 301 may have an area of between about 12 µm×12 µm and about 50 µm×50 µm, such as about 12 µm×50 µm. However, any suitable dimensions may be utilized.

Figure 3B:
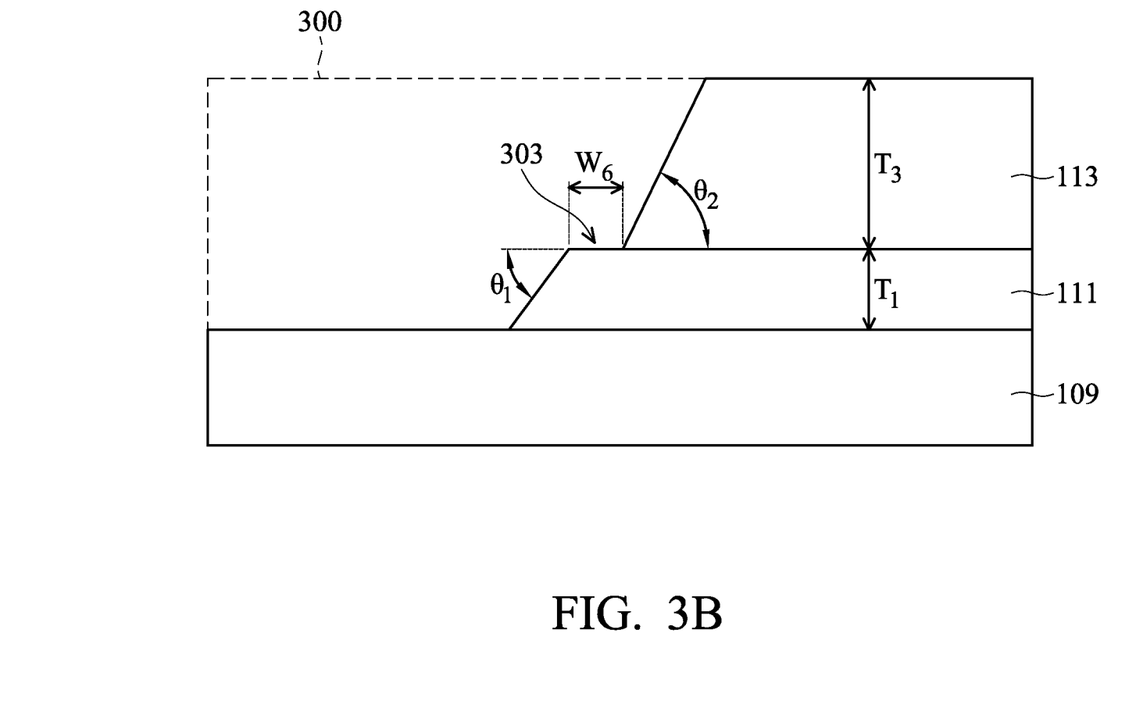

FIG. 3B illustrates a close up view of the dashed box 300 in FIG. 3A. Within the dashed box 300 there is seen the third passivation layer 113 (now reshaped) overlying the second passivation layer 111 and the top redistribution layer 109. With the reshaping of the third passivation layer 113, the second passivation layer 111 may retain the first thickness $T_1$, and the third passivation layer 113 may have a third thickness $T_3$ that is greater than the first thickness $T_1$ and less than or equal to three times the first thickness $T_1$, such as a third thickness $T_3$ of between about 1.5 µm and about 7.5 µm, such as about 4 µm. However, any suitable thicknesses may be utilized.

However, by reshaping the third passivation layer 113 and then etching the underlying second passivation layer 111, the third passivation layer 113 will actually be recessed from the sidewall of the second passivation layer 111 to create a ledge 303 on part of the top surface of the second passivation layer 111. This ledge 303 may have a sixth width $W_6$ that is greater than zero, such as being equal to or greater than about 0.6 µm and less than or equal to about 2 µm. However, any suitable dimension may be used.

Additionally, by etching the second passivation layer 111 as described, the second passivation layer 111 may have a flared (e.g., not perpendicular) sidewall. This flared sidewall may have a first angle $\theta_1$ (e.g., an external angle from a plane that encompasses a top surface of the second passivation layer 111) of between about 50° and about 90°, such as about 53°. Additionally, the reshaping of the third passivation layer 113 may create a sidewall with a second angle $\theta_2$ (e.g., an internal angle from a plane that encompasses a bottom surface of the third passivation layer 113) of greater than or equal to about 50° and less than or equal to about 90°. However, any suitable angles may be utilized.

Figure 4:
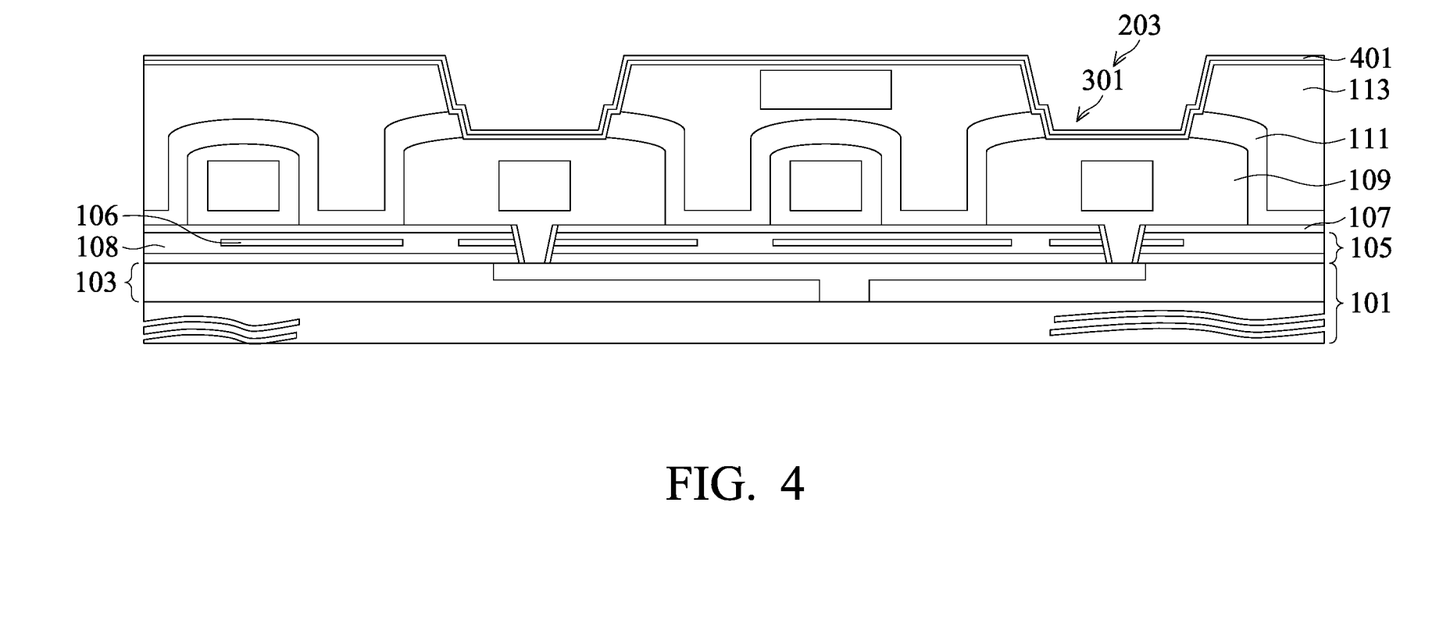
FIG. 4 illustrates formation of a seed layer, in accordance with some embodiments.

FIG. 4 illustrates deposition of a first seed layer 401 over the surfaces of the third passivation layer 113 and lining the sidewalls of the second openings 203 (e.g., within the third passivation layer 113) and the sidewalls of the third openings 301 (e.g., within the second passivation layer 111). In an embodiment the first seed layer 401 is a thin layer of a conductive material that aids in the formation of a thicker layer during subsequent processing steps. The first seed layer 401 may comprise a layer of titanium about 1,000 Å thick followed by a layer of copper about 5,000 Å thick. The first seed layer 401 may be created using processes such as sputtering, evaporation, or PECVD processes, depending upon the desired materials. The first seed layer 401 may be formed to have a thickness of between about 0.3 µm and about 1 µm, such as about 0.5 µm.

Once the first seed layer 401 has been deposited, a photoresist (not separately illustrated) may be deposited and patterned to form a pattern for subsequently formed underbump metallizations 501 (not illustrated in FIG. 4 but illustrated and described further below with respect to FIGS. 5A-5B). In an embodiment the photoresist may be placed on the first seed layer 401 using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

Figure 5A:
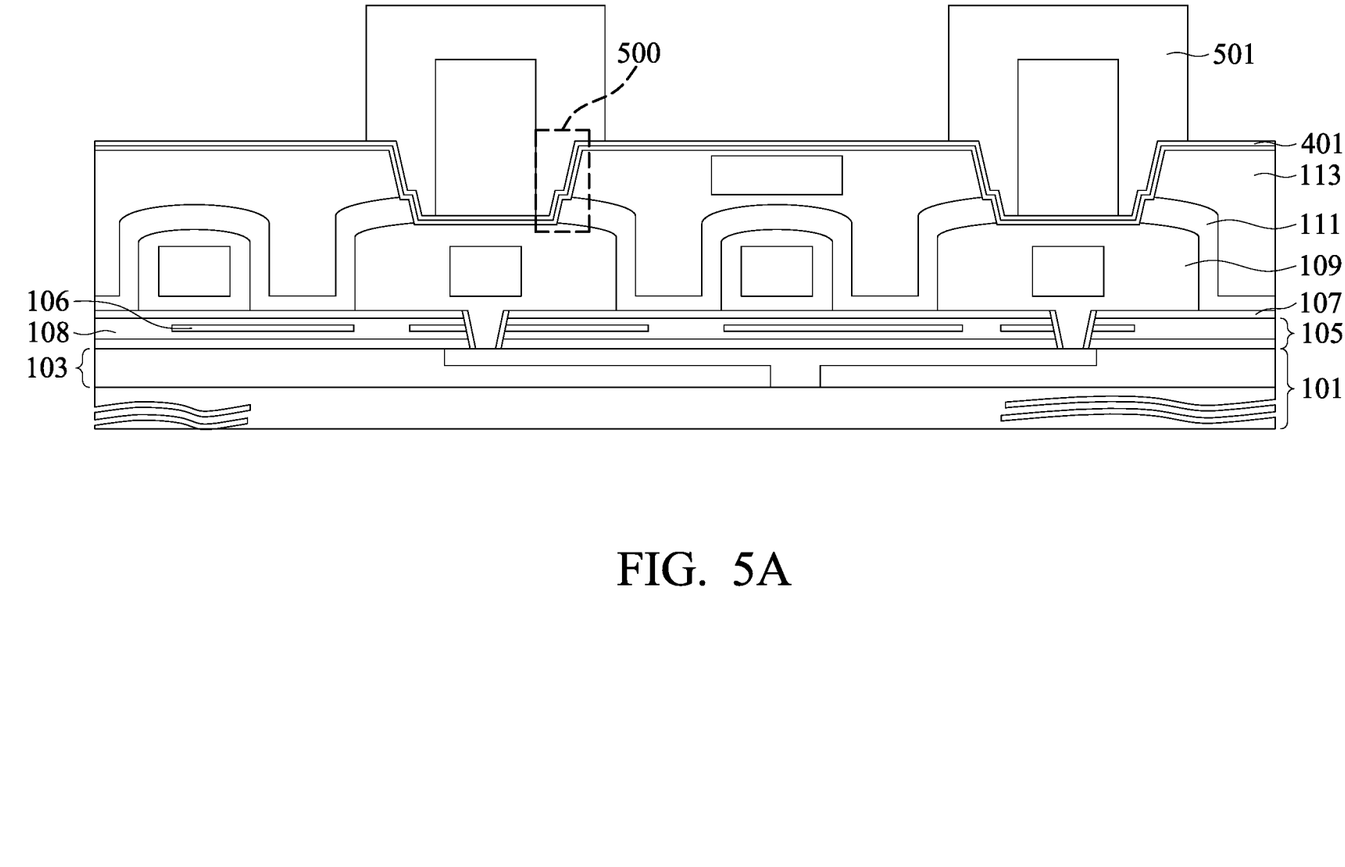
FIGS. 5A-5B illustrate formation of underbump metallizations, in accordance with some embodiments.

FIG. 5A illustrates that, once the first seed layer 401 is deposited and the photoresist is in place, an underbump metallization 501 may be formed on the first seed layer 401. In an embodiment the underbump metallization 501 may comprise three layers of conductive materials, such as a layer of titanium, a layer of copper, and a layer of nickel (with only a single material being illustrated in FIG. 5A for clarity, but not limited thereto). However, one of ordinary skill in the art will recognize that there are many suitable arrangements of materials and layers, such as an arrangement of chrome/chrome-copper an arrangement of titanium/titanium tungsten/copper, or an arrangement of copper/nickel/gold, that are suitable for the formation of the underbump metallization 501. Any suitable materials or layers of material that may be used for the underbump metallization 501 are fully intended to be included within the scope of the embodiments.

In an embodiment the underbump metallization 501 are created by forming each layer over the first seed layer 401. The forming of each layer may be performed using a plating process, such as electrochemical plating, although other processes of formation, such as sputtering, evaporation, or PECVD process, may be used depending upon the desired materials. The underbump metallization 501 may be formed to have a thickness of between about 0.7 µm and about 10 µm, such as about 5 µm.

Additionally, once the underbump metallization 501 has been formed within the photoresist, the photoresist may be removed in order to re-expose the first seed layer 401. In an embodiment the photoresist may be removed using, e.g., an ashing process, whereby the temperature of the photoresist is increased until the photoresist thermally decomposes and then may be removed. However, any other suitable process or combination of processes, such as a series of one or more etching processes, may be utilized.

Figure 5B:
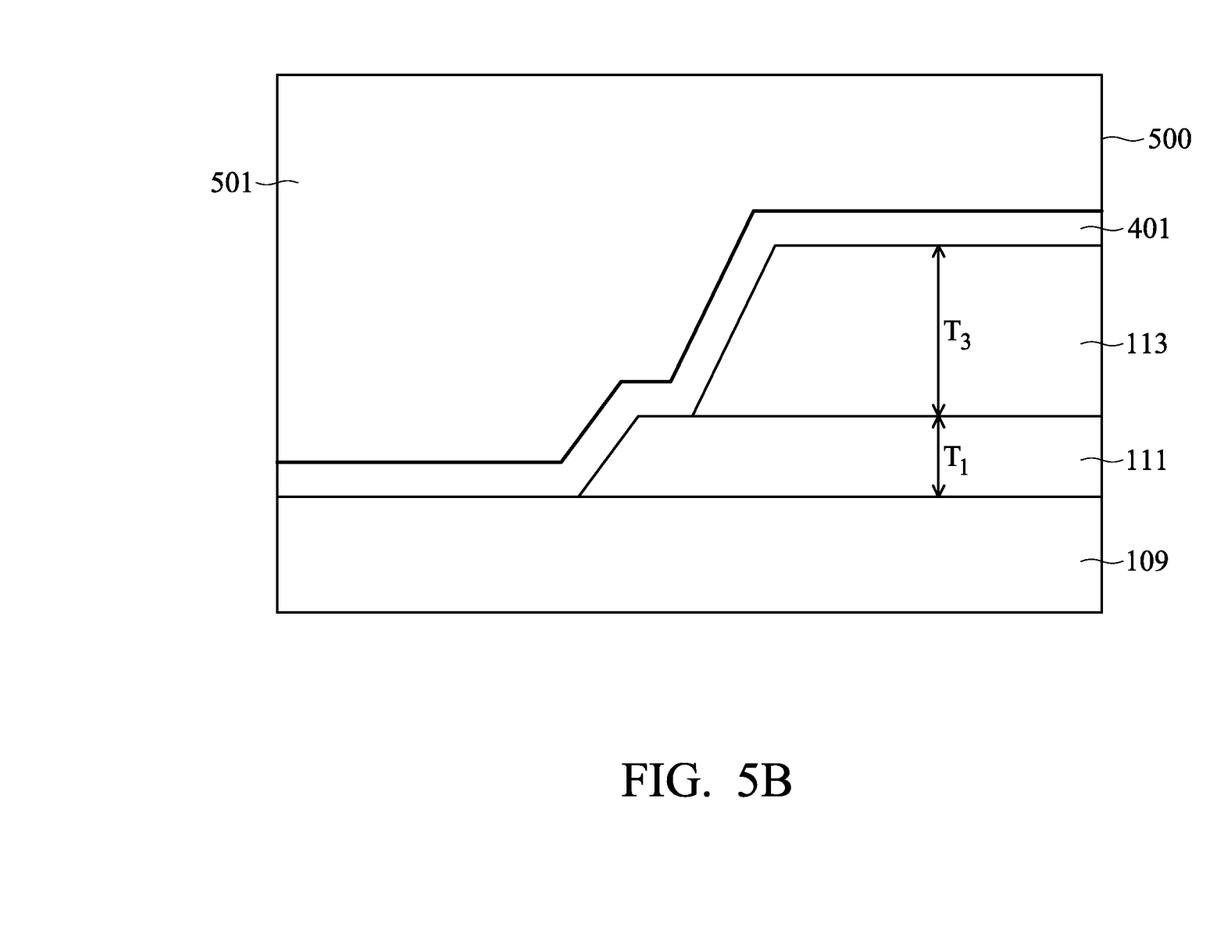

FIG. 5B illustrates a close up view of the dashed box 500 in FIG. 5A once the underbump metallizations 501 have been formed. As can be seen, the first seed layer 401 and the underbump metallization 501 fill the third openings 301 (through the second passivation layer 111) and the second openings 203 (through the third passivation layer 113) such that the first seed layer 401 and the underbump metallization 501 take on the shape of the second openings 203 and the third openings 301, such that sidewalls of the first seed layer 401 have the same angles as the sidewalls of the second passivation layer 111 and the third passivation layer 113.

Figure 6:
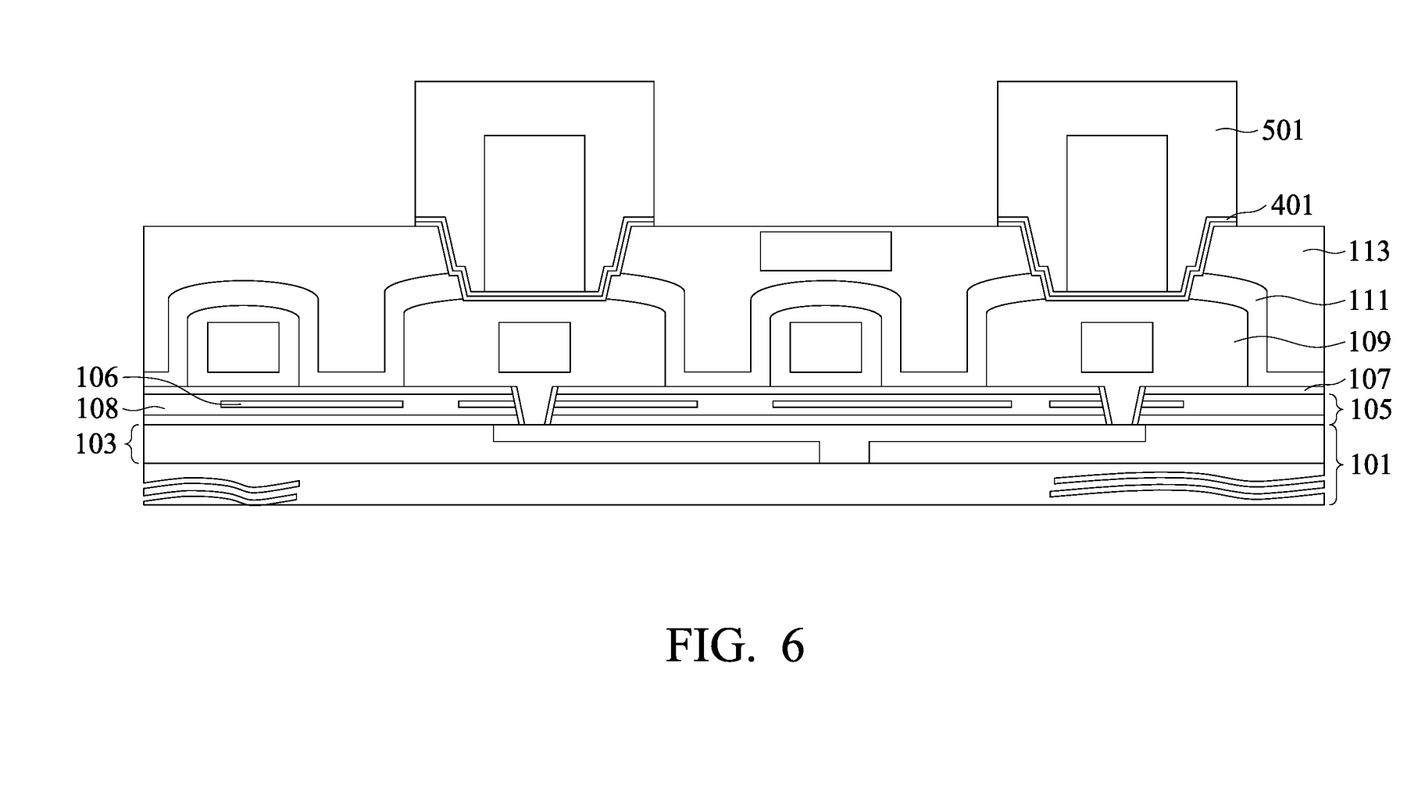
FIG. 6 illustrates an etching of the seed layer, in accordance with some embodiments.

FIG. 6 illustrates that, once the first seed layer 401 has been re-exposed, a removal of the exposed portions of the first seed layer 401 may be performed. In an embodiment the exposed portions of the first seed layer 401 (e.g., those portions that are not covered by the underbump metallization 501) may be removed by, for example, a wet or dry etching process. For example, in a dry etching process reactants may be directed towards the first seed layer 401 using the underbump metallization 501 as masks. In another embodiment, etchants may be sprayed or otherwise put into contact with the first seed layer 401 in order to remove the exposed portions of the first seed layer 401. After the exposed portion of the first seed layer 401 has been etched away, a portion of the third passivation layer 113 is exposed between the underbump metallizations 501.

Figure 7:
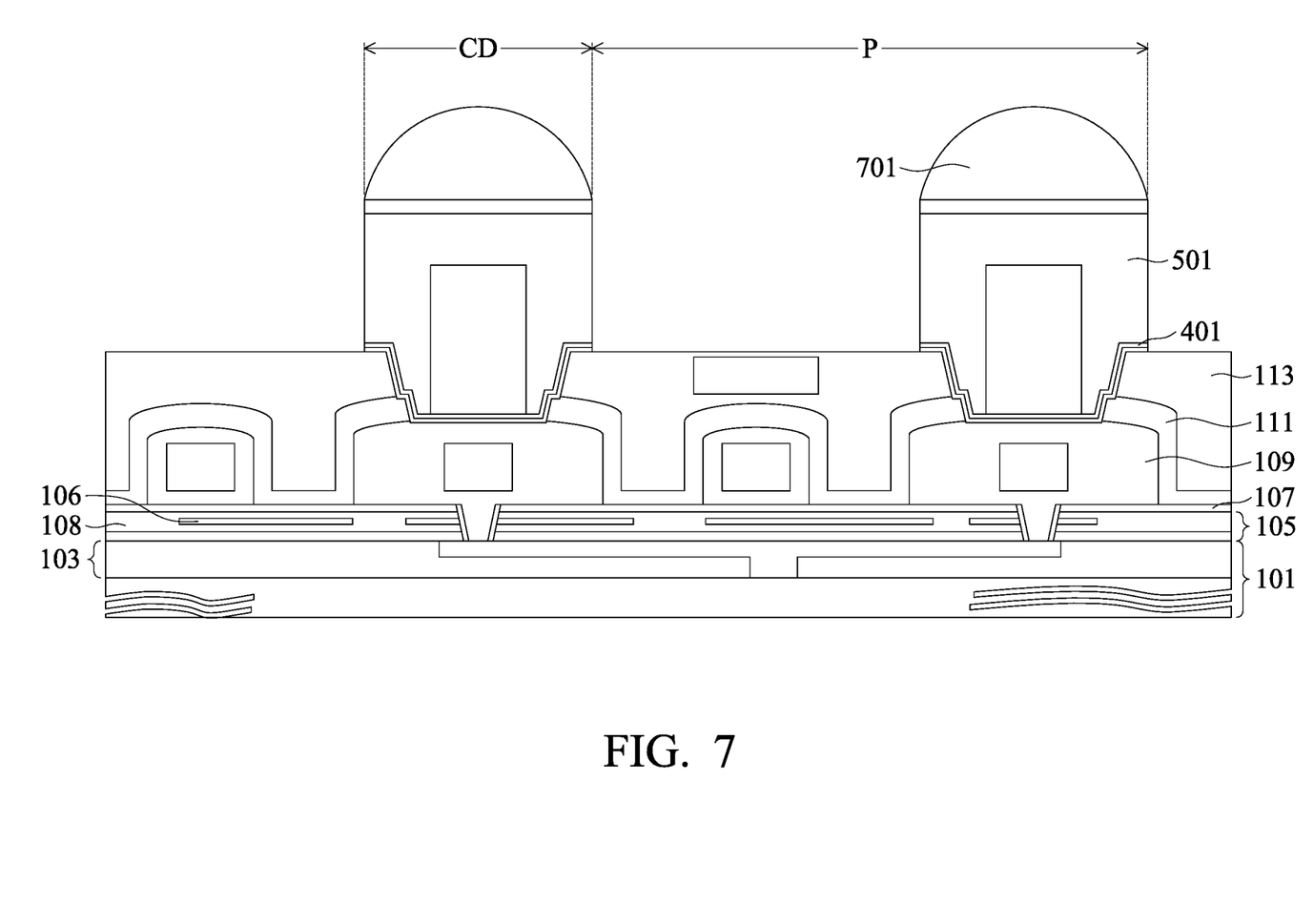
FIG. 7 illustrates placement of bumps, in accordance with some embodiments.

FIG. 7 illustrates formation of conductive bumps 701 (e.g., microbumps) utilizing materials such as solder. In an embodiment in which the conductive bumps 701 are contact bumps, the conductive bumps 701 may comprise a material such as tin, or other suitable materials, such as silver, lead-free tin, or copper. In an embodiment in which the conductive bumps 701 is a tin solder bump, the conductive bumps 701 may be formed by initially forming a layer of tin through such methods such as evaporation, electroplating, printing, solder transfer, ball placement, etc, to a thickness of, e.g., about 20 µm. Once a layer of tin has been formed on the structure, a reflow may be performed in order to shape the material into the desired bump shape.

By utilizing the structure and/or processes described herein, the possibility that cracks occur within the second passivation layer 111 during manufacturing, testing, and operation, can be reduced, and the overall reliability of the package may be increased. For example, by having the ledge 303 present as described, stress within the second passivation layer 111 may be reduced about 9% and by increasing the thickness of the third passivation layer 113 with respect to the second passivation layer 111 (e.g., three times as large), the stress may be reduced by another 9%. As such, during a thermal loading reliability test (e.g., a temperature test that ranges from −55° C. to 125° C.), the stress levels at the edge of the second passivation layer 111 can be reduced from, e.g., 1.09 to 0.78, a reduction of about 31%.

Additionally, by increasing the reliability of the manufacturing process, the improvements in stress relief also allows for certain dimensions to be reduced. For example, in some embodiments the critical dimensions of the conductive bumps 701 may be between about 25 µm and about 70 µm, while the pitch P between adjacent conductive bumps 701 may be between about 50 µm and about 140 µm. As such, a ratio of the critical dimensions (CD) to the bump pitch (P) can be reduced to be less than or equal to 50%, although any suitable ratio may be used. Such improvements help to lower the bump bridge risk between adjacent ones of the conductive bumps 701.

Figure 8:
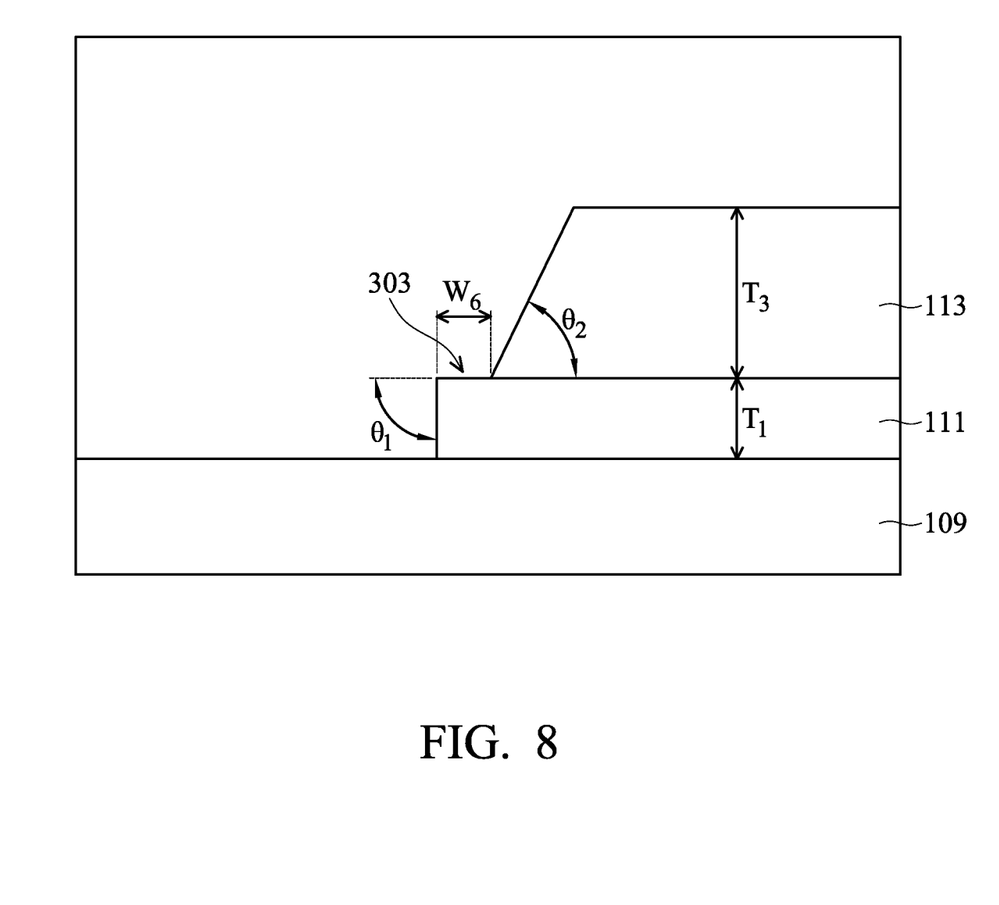
FIG. 8 illustrates another embodiment which utilizes different angles for the passivation layers, in accordance with some embodiments.

FIG. 8 illustrates another embodiment in which the third passivation layer 113 is recessed from the sidewall of the second passivation layer 111 to form the ledge 303. In this embodiment, however, the sidewall of the second passivation layer 111 may be perpendicular or nearly perpendicular to the surface of the underlying top redistribution layer 109. For example, in this embodiment the first angle $\theta_1$ may be greater than or equal to about 80° and may be less than or equal to about 90°. However, any suitable angles may be utilized. In this embodiment the second angle $\theta_2$ may be greater than or equal to about 50° and less than or equal to about 90°, and the ledge 303 may have the sixth width $W_6$ that is greater than zero, such as being equal to or greater than about 0.6 µm. Additionally, the third thickness $T_3$ may still be greater than or equal to the first thickness $T_1$, and may be less than or equal to three times the first thickness $T_1$, such as between about 1.5 µm and about 7.5 µm, and the first thickness $T_1$ may still be greater than or equal to zero and less than or equal to the third thickness $T_3$. However, any suitable thicknesses and angles may be utilized.

Figure 9:
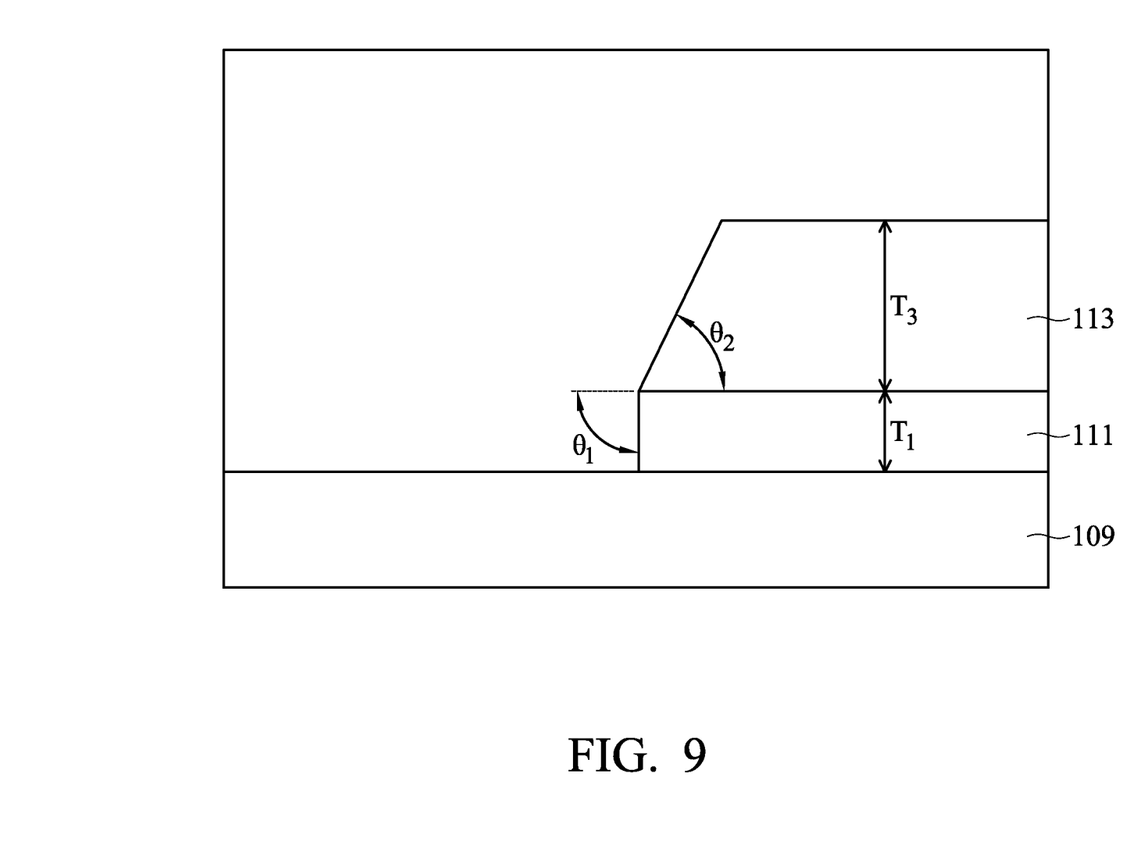
FIG. 9 illustrates another embodiment without a ledge, in accordance with some embodiments.

FIG. 9 illustrates yet another embodiment which utilizes a reshaping of the third passivation layer 113 and which is similar to the embodiment described above with respect to FIG. 8. In this embodiment, however, while the sidewall of the second passivation layer 111 remains perpendicular or substantially perpendicular to the surface of the underlying top redistribution layer 109, the sidewall of the third passivation layer 113 is not recessed from the sidewall of the second passivation layer 111. As such, the sidewall of the third passivation layer 113 intersects the sidewall of the second passivation layer 111, and there is no ledge 303.

In this embodiment the first angle $\theta_1$ may be greater than or equal to 80° and may be less than or equal to about 90°, and the second angle $\theta_2$ may be greater than or equal to about 50° and less than or equal to about 90°. Additionally, the third thickness $T_3$ may still be greater than or equal to the first thickness $T_1$, and may be less than or equal to three times the first thickness $T_1$, such as between about 0.5 µm and about 2.5 µm, and the first thickness $T_1$ may be greater than or equal to zero and less than or equal to the third thickness $T_3$. However, any suitable thicknesses and angles may be utilized.

By utilizing any of the embodiments described herein, stresses within the second passivation layer 111 may be reduced and/or mitigated to help increase the reliability of the device. For example, by having the first angle $\theta_1$ be greater than or equal to 80° and less than or equal to 90°, the stress within the second passivation layer 111 can be reduced about 3%. Additionally, by having the ledge 303 present as described, stress within the second passivation layer 111 may be reduced about 9% while increasing the thickness of the third passivation layer 113 with respect to the second passivation layer 111 while still remaining below three times the thickness of the second passivation layer 111 may reduce the stresses by another 9%. Such improvements increase the reliability while also allowing individual components (e.g., the conductive bumps 701) to be reliably placed closer to each other, improving device density and/or lowering the footprint of the device.

In an embodiment, a method of manufacturing a semiconductor device, the method including: depositing a first passivation layer over a top redistribution structure, the top redistribution structure over a semiconductor die; depositing a second passivation layer over the first passivation layer; forming a first opening through the second passivation layer, the first opening having sidewalls perpendicular to the first passivation layer; reshaping the first opening into a second opening, wherein the second opening has flared sidewalls with respect to the first passivation layer; forming a third opening through the first passivation layer, wherein the third opening has a different slope from the flared sidewalls; and filling the second opening and the third opening with a conductive material. In an embodiment, the second opening has an internal angle adjacent to the first passivation layer of greater than or equal to 50° and less than or equal to 90°. In an embodiment, the third opening has an external angle adjacent to the second passivation layer of greater than or equal to 80° and less than or equal to 90°. In an embodiment, after the forming of the third opening a ledge of the first passivation layer is exposed by the second passivation layer. In an embodiment, the ledge has a width of greater than about 0.6 μm and less than or equal to about 2 μm. In an embodiment, the first passivation layer has a first thickness and the second passivation layer has a second thickness larger than the first thickness. In an embodiment, the second thickness is less than three times as large as the first thickness.

In another embodiment, a method of manufacturing a semiconductor device, the method including: forming a first opening through a first passivation layer to expose a second passivation layer, the first opening having a first sidewall; curing the first passivation layer to modify a slope of the first sidewall to a first slope; after the curing forming a second opening through the second passivation layer to expose a redistribution structure, the redistribution structure being connected to a semiconductor die, wherein the second opening has a second sidewall with a second slope different from the first slope; and forming an external connection within the first opening and the second opening. In an embodiment, after the curing the first sidewall has an angle of between 50° and 90°. In an embodiment, the second opening has an external angle between 80° and 90°. In an embodiment, the second opening has an external angle between 50° and 90°. In an embodiment, the first sidewall intersects a second sidewall of the second opening. In an embodiment, after the forming of the second opening a ledge of the second passivation layer is exposed by the first passivation layer. In an embodiment, the ledge has a width of greater than about 0.6 μm and less than or equal to about 2 μm.

In yet another embodiment, a semiconductor device includes: an external connection extending through a first passivation layer and a second passivation layer, wherein a sidewall of the external connection includes: a first portion sharing a first interface with the first passivation layer, the first portion having a first angle; a second portion sharing a second interface with the second passivation layer, the second portion having a second angle different from the first angle; a redistribution structure in physical contact with both the external connection and the first passivation layer; and a semiconductor die in electrical connection with the redistribution structure. In an embodiment, the first passivation layer has a first thickness, the second passivation layer has a second thickness, and the second thickness is greater than the first thickness. In an embodiment, the second thickness is less than three times the first thickness. In an embodiment, the second passivation layer exposes a ledge of the first passivation layer. In an embodiment, the ledge has a width of greater than about 0.6 μm and less than or equal to about 2 μm. In an embodiment, the second passivation layer has an internal angle adjacent to the first passivation layer of between about 80° and about 90°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    depositing a first passivation layer over a top redistribution structure, the top redistribution structure over a semiconductor die;
    depositing a second passivation layer over the first passivation layer;
    forming a first opening through the second passivation layer, the first opening having sidewalls perpendicular to the first passivation layer;
    reshaping the first opening into a second opening, wherein the second opening has flared sidewalls with respect to the first passivation layer;
    forming a third opening through the first passivation layer, wherein the third opening has a different slope from the flared sidewalls; and
    filling the second opening and the third opening with a conductive material, wherein after the filling of the conductive material the conductive material is in physical contact with the second passivation layer and extends further away from the top redistribution structure than the second passivation layer.

2. The method of claim 1, wherein the second opening has an internal angle adjacent to the first passivation layer of greater than or equal to 50° and less than or equal to 90°.

3. The method of claim 1, wherein the third opening has an external angle adjacent to the second passivation layer of greater than or equal to 80° and less than or equal to 90°.

4. The method of claim 1, wherein after the forming of the third opening a ledge of the first passivation layer is exposed by the second passivation layer.

5. The method of claim 4, wherein the ledge has a width of greater than about 0.6 μm and less than or equal to about 2 μm.

6. The method of claim 1, wherein the first passivation layer has a first thickness and the second passivation layer has a second thickness larger than the first thickness.

7. The method of claim 6, wherein the second thickness is less than three times as large as the first thickness.

8. A method of manufacturing a semiconductor device, the method comprising:
    forming a first opening through a first passivation layer to expose a second passivation layer, the first opening having a first sidewall;
    curing the first passivation layer to modify a slope of the first sidewall to a first slope, wherein the curing expands the first opening by about 2.2 μm;
    after the curing forming a second opening through the second passivation layer to expose a redistribution structure, the redistribution structure being connected to a semiconductor die, wherein the second opening has a second sidewall with a second slope different from the first slope; and
    forming an external connection within the first opening and the second opening.

9. The method of claim 8, wherein after the curing of the first sidewall has an angle of between 50° and 90°.

10. The method of claim 8, wherein the second opening has an external angle between 80° and 90°.

11. The method of claim 8, wherein the second opening has an external angle between 50° and 90°.

12. The method of claim 8, wherein the first sidewall intersects a second sidewall of the second opening.

13. The method of claim 8, wherein after the forming the second opening a ledge of the second passivation layer is exposed by the first passivation layer.

14. The method of claim 13, wherein the ledge has a width of greater than about 0.6 μm and less than or equal to about 2 μm.

15. A semiconductor device comprising:
- an external connection extending through a first passivation layer and a second passivation layer, wherein a sidewall of the external connection comprises:
  - a first portion sharing a first interface with the first passivation layer, the first portion having a first angle, the first interface being planar;
  - a second portion sharing a second interface with the second passivation layer, the second portion having a second angle different from the first angle, the second interface being planar;
- a redistribution structure in physical contact with both the external connection and the first passivation layer, wherein the external connection extends away from the redistribution structure further than the second passivation layer; and
- a semiconductor die in electrical connection with the redistribution structure.

16. The semiconductor device of claim 15, wherein the first passivation layer has a first thickness, the second passivation layer has a second thickness, and the second thickness is greater than the first thickness.

17. The semiconductor device of claim 16, wherein the second thickness is less than three times the first thickness.

18. The semiconductor device of claim 15, wherein the second passivation layer exposes a ledge of the first passivation layer.

19. The semiconductor device of claim 18, wherein the ledge has a width of greater than about 0.6 μm and less than or equal to about 2 μm.

20. The semiconductor device of claim 15, wherein the second passivation layer has an internal angle adjacent to the first passivation layer of between about 80° and about 90°.

* * * * *